(12) United States Patent
Okura et al.

(10) Patent No.: US 10,767,262 B2
(45) Date of Patent: Sep. 8, 2020

(54) GAS SUPPLY APPARATUS AND GAS SUPPLY METHOD

(71) Applicant: TOKYO ELECTRON LIMITED, Tokyo (JP)

(72) Inventors: Shigeyuki Okura, Nirasaki (JP); Yu Nunoshige, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 250 days.

(21) Appl. No.: 15/663,866

(22) Filed: Jul. 31, 2017

(65) Prior Publication Data

US 2018/0037991 A1 Feb. 8, 2018

(30) Foreign Application Priority Data

Aug. 3, 2016 (JP) .................................. 2016-152984

(51) Int. Cl.
| | |
|---|---|
| C23C 16/455 | (2006.01) |
| C23C 16/04 | (2006.01) |
| C23C 16/34 | (2006.01) |
| C23C 16/52 | (2006.01) |

(52) U.S. Cl.
CPC ...... *C23C 16/45527* (2013.01); *C23C 16/045* (2013.01); *C23C 16/34* (2013.01); *C23C 16/45544* (2013.01); *C23C 16/45561* (2013.01); *C23C 16/52* (2013.01)

(58) Field of Classification Search
CPC ........ C23C 16/45527; C23C 16/45544; C23C 16/52
See application file for complete search history.

(56) References Cited

U.S. PATENT DOCUMENTS

| | | | |
|---|---|---|---|
| 2006/0045970 A1* | 3/2006 | Seo | .................... C23C 16/45544 427/248.1 |
| 2014/0295083 A1* | 10/2014 | Nasu | .................... C23C 16/4408 427/255.28 |
| 2015/0087159 A1* | 3/2015 | Kuribayashi | ..... H01J 37/32449 438/765 |

FOREIGN PATENT DOCUMENTS

| | | |
|---|---|---|
| JP | 2014-198872 A | 10/2014 |
| JP | 2015-124422 A | 7/2015 |
| JP | 2016-23324 A | 2/2016 |
| JP | 2016105440 A | 6/2016 |
| KR | 10-2011-0028203 A | 3/2011 |
| KR | 1020140118784 A | 10/2014 |

(Continued)

*Primary Examiner* — Kelly M Gambetta
(74) *Attorney, Agent, or Firm* — Nath, Goldberg & Meyer; Jerald L. Meyer

(57) ABSTRACT

A gas supply apparatus for forming a film by supplying a source gas, a substitution gas, and a reaction gas to a substrate in a processing chamber includes a source gas flow passage; a reaction gas flow passage; a first and second carrier gas flow passages connected to the source gas flow passage and the reaction gas flow passage; a substitution gas flow passage configured to supply the substitution gas into the processing chamber through a supply control device; a gas storage part installed in the substitution gas flow passage, and configured to store the substitution gas; a valve installed in the substitution gas flow passage, and installed in a downstream side of the gas storage part; and a control unit configured to control opening/closing of the valve such that the substitution gas is stored in the gas storage part to increase an internal pressure of the gas storage part.

5 Claims, 15 Drawing Sheets

(56) References Cited

FOREIGN PATENT DOCUMENTS

KR    1020140118784    7/2017

* cited by examiner

GAS SUPPLY APPARATUS AND GAS SUPPLY METHOD

CROSS-REFERENCE TO RELATED APPLICATION

This application is based upon and claims the benefit of priority from Japanese Patent Application No. 2016-152984, filed on Aug. 3, 2016, the entire contents of which are incorporated herein by reference.

TECHNICAL FIELD

The present disclosure relates to a gas supply apparatus and a gas supply method that are used to perform a film forming process on a substrate in a processing chamber under a vacuum atmosphere.

BACKGROUND

Atomic Layer Deposition (ALD) may be used to form a film on a semiconductor wafer (hereinafter, referred to as a wafer), which is a substrate. In the ALD, a source gas to be adsorbed onto a surface of a wafer and a reaction gas to react with the source gas are alternately supplied into a processing chamber under a vacuum atmosphere a plurality of times to accumulate an atomic layer of a reaction product on the surface of the wafer, thereby forming a film. In order to prevent the source gas and the reaction gas from undergoing a gas phase reaction and thereby generating particles in a region other than the surface of the wafer within the processing chamber, the source gas and the reaction gas are supplied at a time interval. Further, between the time period during which the source gas is supplied and the time period during which the reaction gas is supplied, an inert gas is supplied into the processing chamber, and the atmosphere in the processing chamber is thus purged and replaced with an inert gas atmosphere. There is known a technique of film forming apparatuses for performing the aforementioned ALD.

SUMMARY

Since it is necessary to perform a purge process as described above, for example, an inert gas may be continuously supplied into the processing chamber at a predetermined flow rate while the ALD is being performed. The inert gas operates as a carrier gas for the source gas or the reaction gas while the source gas or the reaction gas is being supplied, and operates as a purge gas while the source gas and the reaction gas are not supplied.

With the miniaturization of wiring progresses, a recess having a relatively large aspect ratio tends to be formed on the surface of a wafer on which the ALD is performed, and it is required to perform the ALD to ensure the good step coverage even in the case where such a recess is formed. To this end, it may be considered to increase the partial pressure of the source gas in the processing chamber by increasing the flow rate of the source gas.

However, when the flow rate of the source gas is increased as described above, it is necessary to increase the purging time to prevent particles from being generated, and thus more time is spent in forming a film. Furthermore, since a carrier gas is supplied into the processing chamber at a relatively high flow rate to perform a purge process as described above, when the partial pressure of the source gas is sufficiently increased, the flow rate at which the source gas is supplied into the processing chamber is likely to increase significantly. Therefore, it is concerned that the source gas may be attached to a flow passage for supplying the source gas to the processing chamber, and thus the frequency of maintenance of the apparatus is likely to increase. Due to this, a technology is required that can form a film having the good coverage on a substrate even when the source gas is supplied at a relatively low flow rate, and that can rapidly purge the atmosphere in the processing chamber.

There is known a film forming apparatus for performing the ALD. The film forming apparatus includes a bypass line in which upstream and downstream ends of the bypass line is connected to a gas flow passage that connects a processing chamber and a supply source of an $N_2$ (nitrogen) gas operating as a carrier gas and a purge gas for process gases (a source gas and a reaction gas). In the film forming apparatus, a valve provided on the bypass line is closed when the process gases are supplied into the processing chamber, and the valve is opened to increase the relative flow rate of the $N_2$ gas supplied into the processing chamber when a purge process is performed. However, the flow rate of the $N_2$ gas in the bypass line is controlled only by opening/closing the valve. Accordingly, it is difficult to find out the extent to which the gas flows in the gas flow passage and the bypass line, and it is concerned that there is difficulty in controlling the flow rate of the $N_2$ gas supplied into the processing chamber. Furthermore, a technology is required that can further reduce a purging time, compared with this film forming apparatus.

There is known another film forming apparatus for performing the ALD. The film forming apparatus includes a source gas flow passage connecting a source gas supply source and a processing chamber, a first $N_2$ gas flow passage branching from the source gas flow passage, and a second $N_2$ gas flow passage for supplying an $N_2$ gas, which is a purge gas, to the processing chamber independently of the source gas flow passage and the first $N_2$ gas flow passage. However, the second $N_2$ gas flow passage is provided only with a valve and a mass flow controller. Due to this, it is difficult to supply a purge gas into the processing chamber at a sufficient flow rate for a short period of time.

The present disclosure provides a technology for forming a film by alternately supplying a source gas and a reaction gas a plurality of times to a substrate in a processing chamber, whereby it is possible to prevent an increase in the flow rate of the source gas required for forming a film and to increase the flow rate of a substitution gas that replaces the atmosphere in the processing chamber, thereby enhancing the throughput.

According to one embodiment of the present disclosure, there is provided a gas supply apparatus for forming a film by sequentially supplying a source gas, a substitution gas, and a reaction gas to a substrate in a processing chamber under a vacuum atmosphere for a plurality of cycles, wherein the substitution gas substitutes an atmosphere, and the reaction gas reacts with the source gas and generates a reaction product on the substrate, the apparatus including: a source gas flow passage configured to supply the source gas into the processing chamber; a reaction gas flow passage installed independently of the source gas flow passage, and configured to supply the reaction gas into the processing chamber; a first carrier gas flow passage and a second carrier gas flow passage connected to the source gas flow passage and the reaction gas flow passage, respectively, and configured to supply a carrier gas; a substitution gas flow passage configured to supply the substitution gas into the processing chamber through a supply control device, the supply control device being different from carrier gas supply control devices installed in the first carrier gas flow passage and the second carrier gas flow passage; a gas storage part installed in the substitution gas flow passage, and configured to store the substitution gas; a valve installed in the substitution gas flow passage, and installed in a downstream side of the gas storage part; and a control unit configured to control opening and closing of the valve such that after the substitution gas is stored in the gas storage part to increase an internal pressure of the gas storage part, the substitution gas is supplied into the processing chamber from the gas storage part.

According to another embodiment of the present disclosure, there is provided a gas supply method for forming a film by sequentially supplying a source gas, a substitution gas, and a reaction gas to a substrate in a processing chamber under a vacuum atmosphere for a plurality of cycles, wherein the substitution gas substitutes an atmosphere, and the reaction gas reacts with the source gas and generates a reaction product on the substrate, the method including: supplying the source gas to a source gas flow passage so as to the source gas into the processing chamber; supplying the reaction gas to a reaction gas flow passage installed independently of the source gas flow passage, so as to the reaction gas into the processing chamber; supplying a carrier gas to a first carrier gas flow passage and a second carrier gas flow passage connected to the source gas flow passage and the reaction gas flow passage, respectively; supplying the substitution gas to a substitution gas flow passage provided with a supply control device so as to supply the substitution gas into the processing chamber, the supply control device being different from carrier gas supply control devices installed in the first carrier gas flow passage and the second carrier gas flow passage; storing the substitution gas in a gas storage part installed in the substitution gas flow passage; and opening and closing a valve installed in the substitution gas flow passage and installed in a downstream side of the gas storage part such that after the substitution gas is stored in the gas storage part to increase an internal pressure of the gas storage part, the substitution gas is supplied into the processing chamber from the gas storage part.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
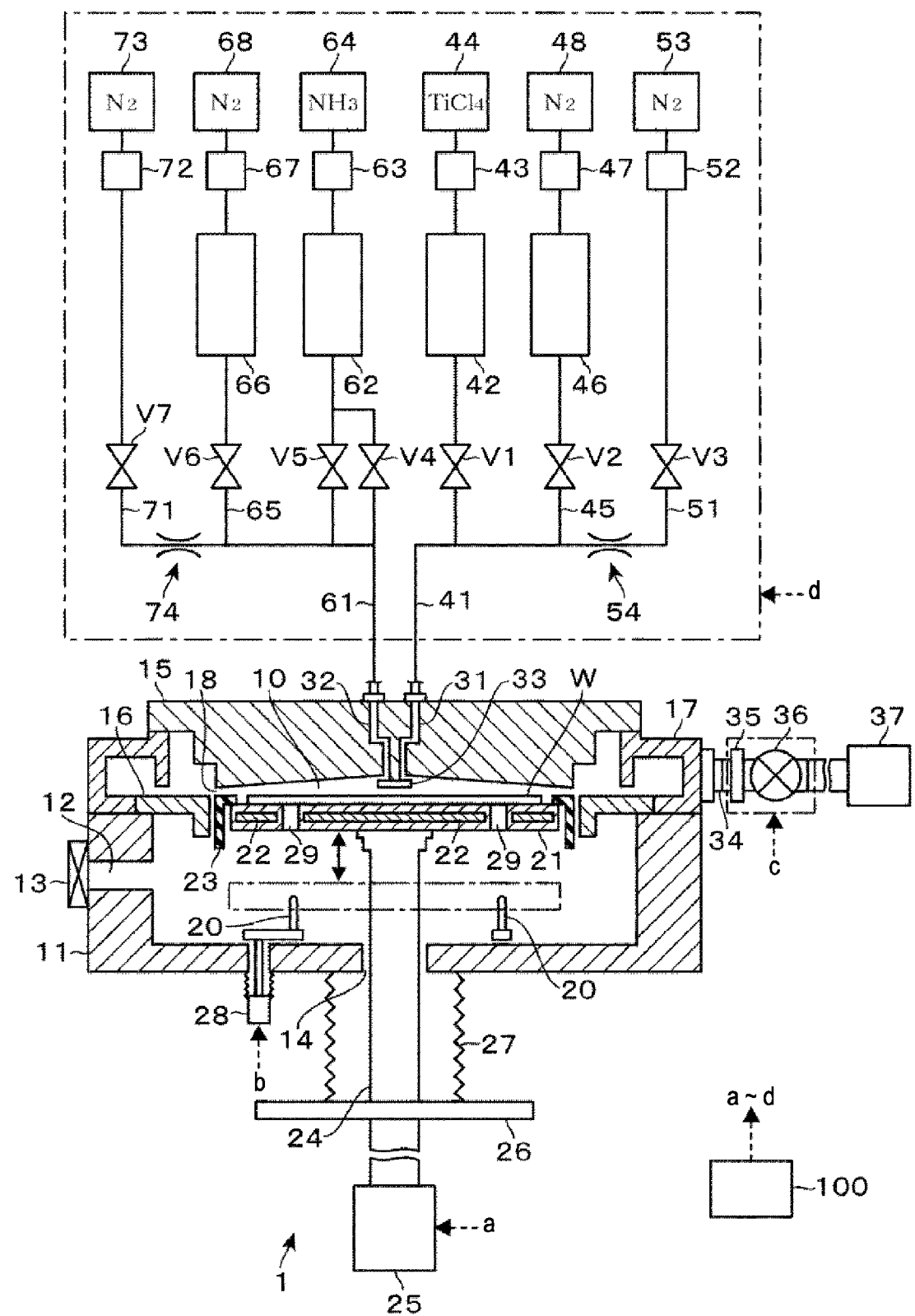
FIG. 1 is a longitudinal sectional view of a film forming apparatus having a gas supply apparatus according to the present disclosure.
Figure 2:
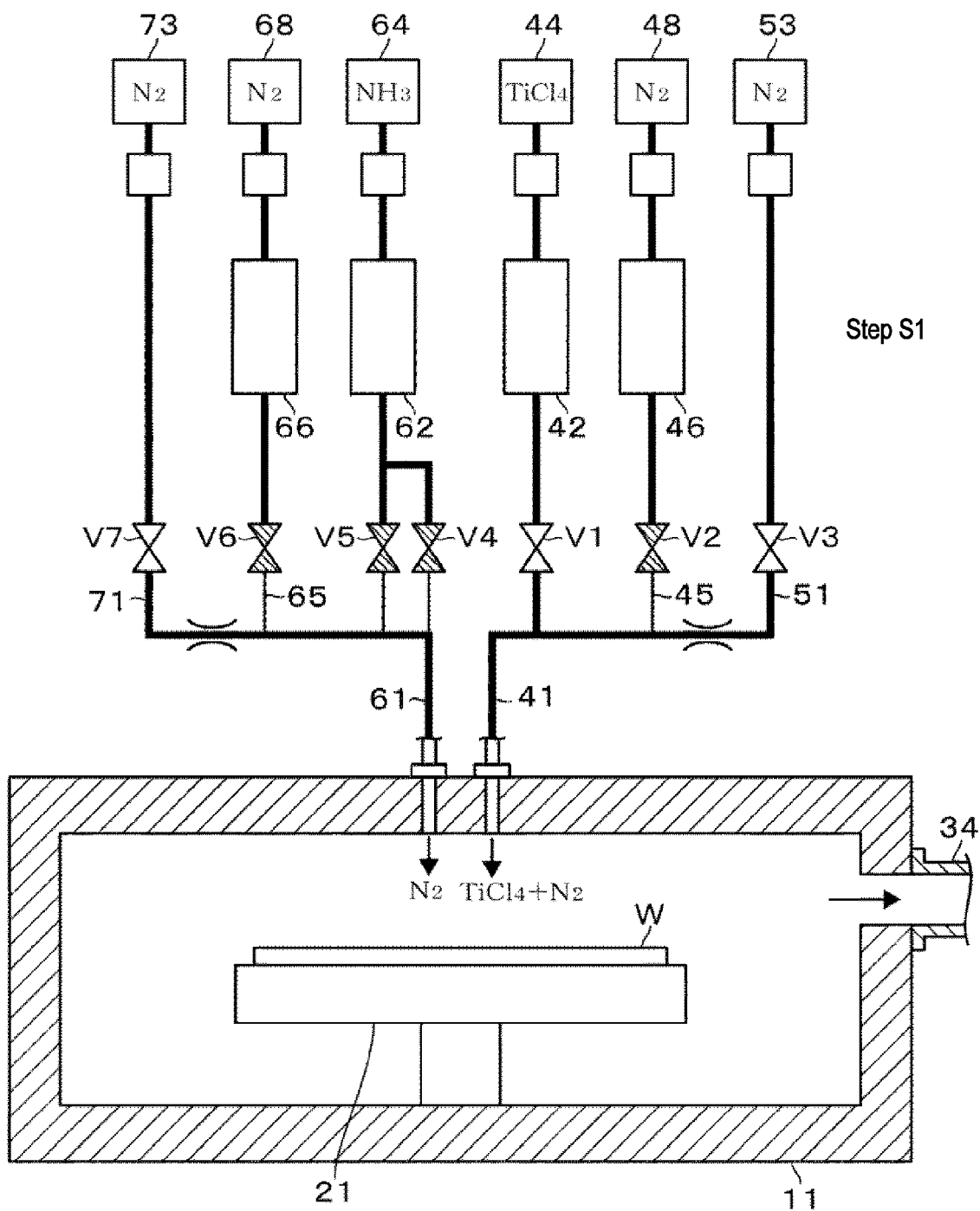
FIGS. 2 to 5 are schematic views for explaining a process conducted by the film forming apparatus.
Figure 3:
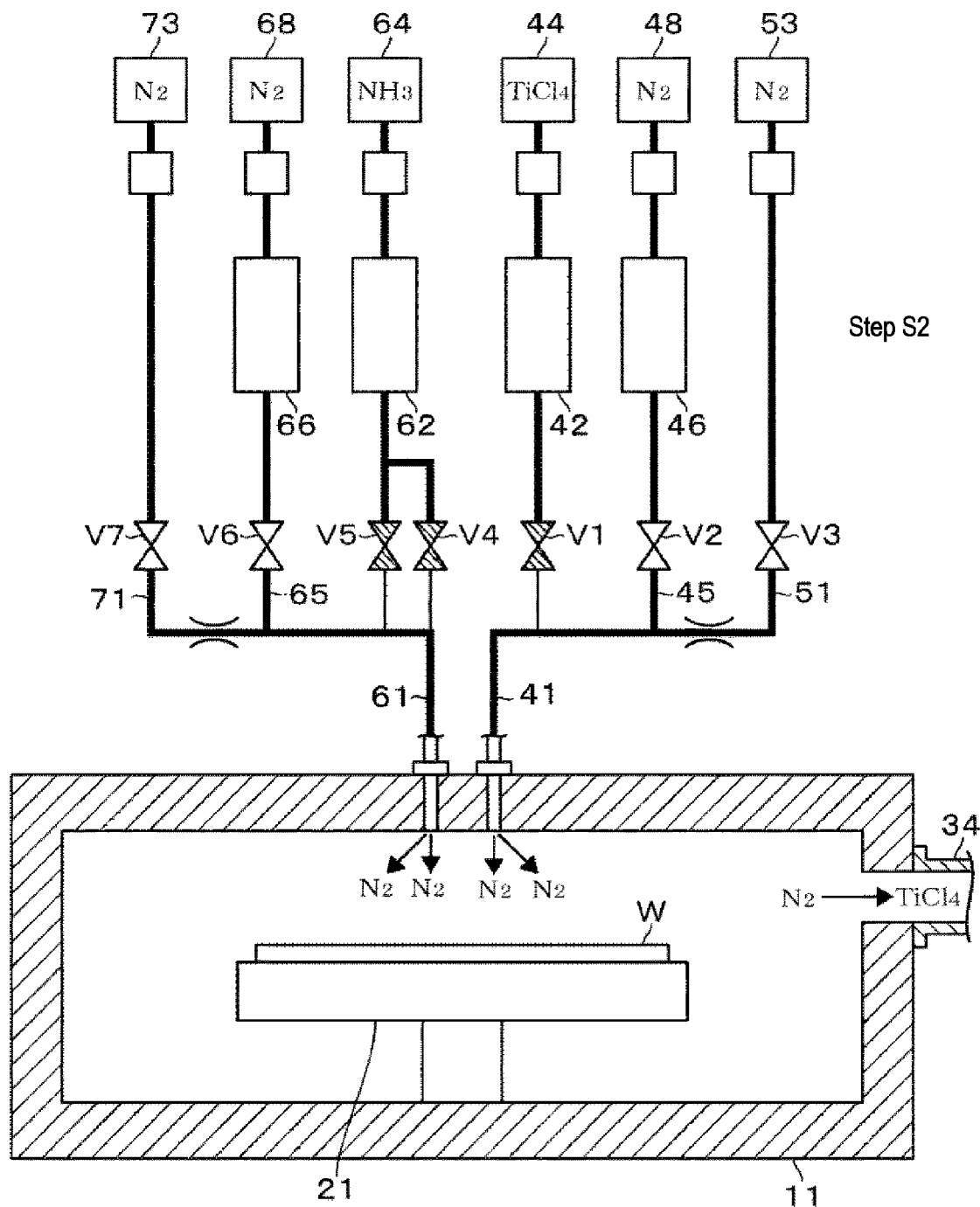
Figure 4:
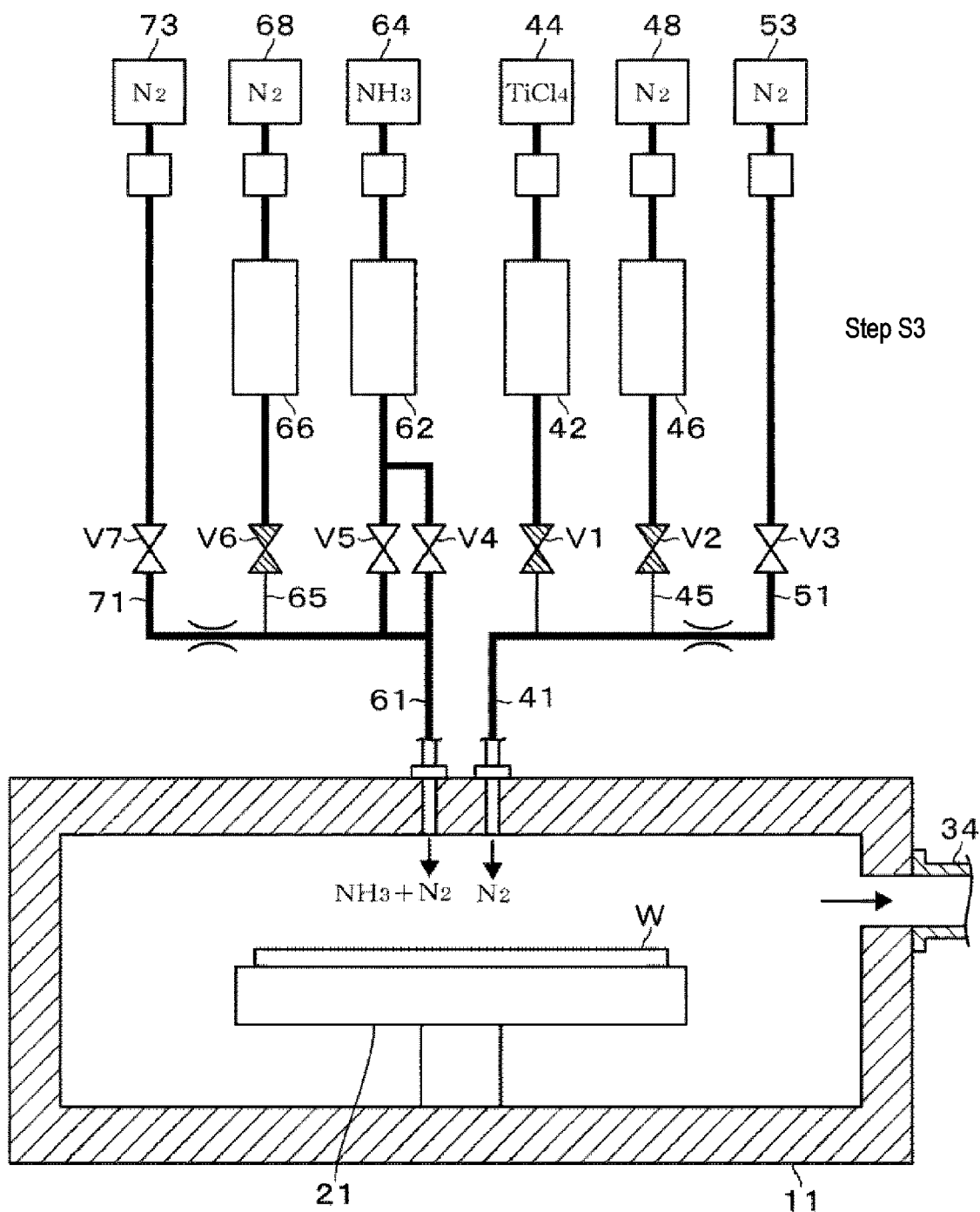
Figure 5:
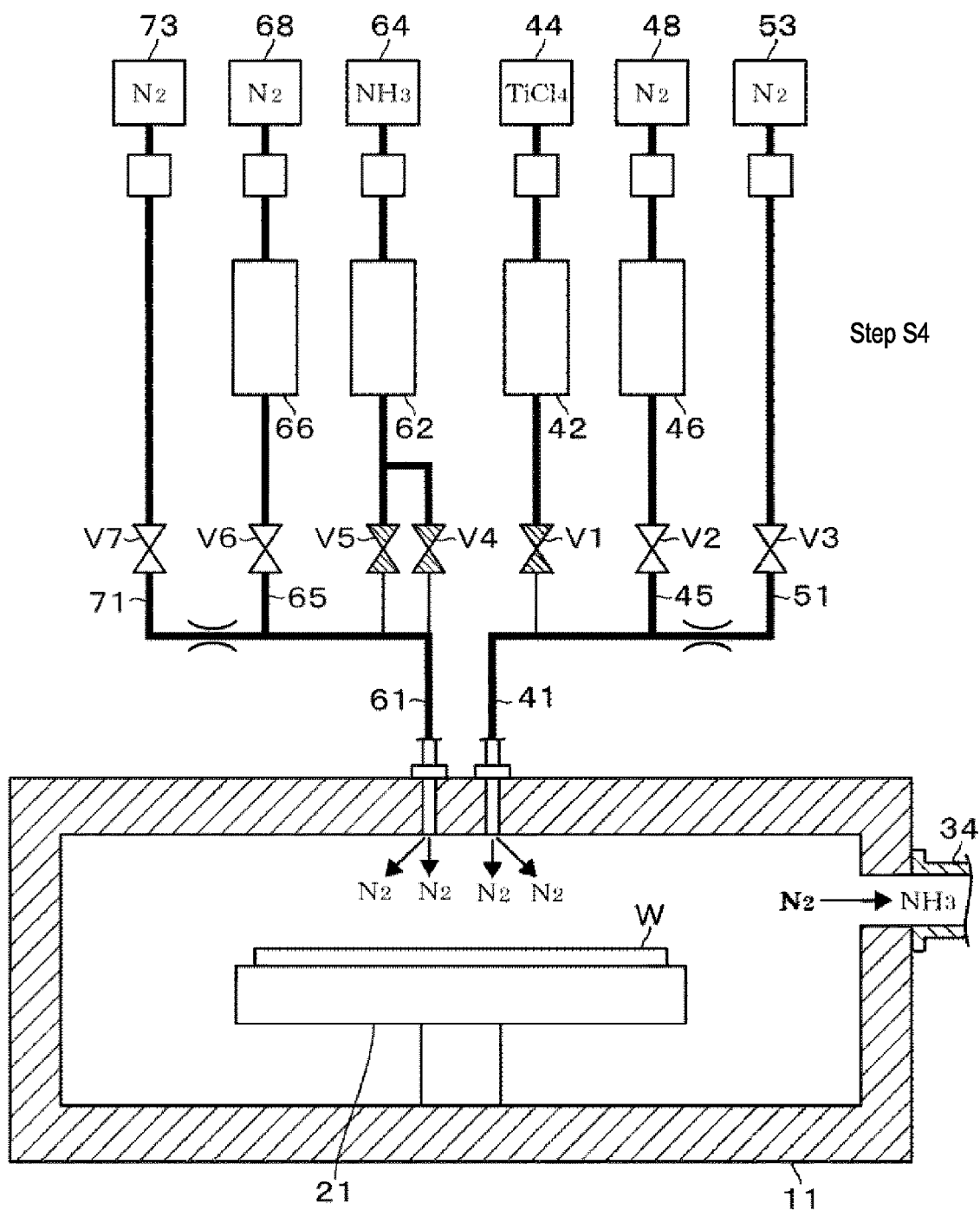

A film forming apparatus 1 to which a gas supply apparatus according to an embodiment of the present disclosure is applied will be described with reference to the longitudinal sectional view of FIG. 1. The film forming apparatus 1 has a flat circular processing chamber 11. A vacuum atmosphere is formed in the processing chamber 11, and a wafer W, which is a substrate, is placed therein. For example, a concave-convex pattern is formed on the surface of the wafer W to form an interconnection wiring. The film forming apparatus 1 forms a titanium nitride (TiN) film on the wafer W by performing the ALD on the wafer W by alternately and repeatedly supplying a titanium tetrachloride ($TiCl_4$) gas, which is a source gas, and an ammonia ($NH_3$) gas, which is a reaction gas. Between the time period during which the $TiCl_4$ gas is supplied and the time period during which the $NH_3$ gas is supplied, a nitrogen ($N_2$) gas, which is an inert gas, is supplied as a purge gas to substitute an $N_2$ gas atmosphere for the $TiCl_4$ or $NH_3$ gas atmosphere in the processing chamber 11. Furthermore, during the film forming processing using the ALD, an $N_2$ gas is continuously supplied into the processing chamber 11 as a carrier gas for introducing the $TiCl_4$ gas and the $NH_3$ gas into the processing chamber 11.

In the drawing, reference numeral 12 denotes a wafer (W) transfer port opened to the sidewall of the processing chamber 11. The wafer transfer port 12 is opened and closed by a gate valve 13. Reference numeral 21 denotes a horizontal susceptor installed in the processing chamber 11 to load the wafer W thereon. A heater 22 is embedded in the susceptor 21 to heat the wafer W to a predetermined temperature. Reference numeral 23 denotes a cylindrical cover member installed to surround the susceptor 21. Reference numeral 24 denotes a vertical column supporting a lower portion of the susceptor 21, and a lower end of the column 24 extends from the processing chamber 11 to the outside through an opening 14 formed through a bottom of the processing chamber 11 and is connected to an elevating mechanism 25. Reference numeral 26 is a flange mounted on the column 24. Reference numeral 27 is a bellows connected to the flange 26 and an outer peripheral portion of the opening 14 to ensure the air-tightness of the processing chamber 11.

The elevating mechanism 25 vertically moves up and down the susceptor 21 between a processing position on an upper side of the processing chamber 11 and a transfer position on a lower side of the processing chamber 11, wherein the processing position and the transfer position are shown by a solid line and a dash-dot-dash line in the drawing, respectively. In the transfer position, the wafer W is transferred between, for example, three lifting pins 20 (only two of them are shown in the drawing), which lift up the wafer W by a lifting mechanism 28 while passing through holes 29 formed through the susceptor 21, and a transfer mechanism (not shown) that enters the processing chamber 11 through the transfer port 12.

A ceiling surface of the processing chamber 11 is formed obliquely downward from a central portion thereof to an outer peripheral portion thereof, such that a flat conical processing space 10 surrounded by a surface of the susceptor 21, a surface of the cover member 23, and the ceiling surface of the processing chamber 11 is formed when the susceptor 21 is located at the processing position. In a central portion of a ceiling plate 15 of the processing chamber 11 that forms the aforementioned ceiling surface, two gas supply passages 31 and 32 are formed through the ceiling plate 15 in the thickness direction. A dispersion plate 33 is installed, for example, horizontally below the gas supply passages 31 and 32 to disperse the gases discharged from the gas supply passage 31 and 32 within the processing space 10.

In the drawing, reference numeral 16 denotes an annular member located above the transfer port 12 and protruding from an inner wall of the processing chamber 11, and the annular member 16 is disposed to surround the cover member 23 while being adjacent to an outer side of the cover member 23 of the susceptor 21 disposed in the processing position. Reference numeral 17 denotes an exhaust duct curvedly bent in an annular shape to form a sidewall of the processing chamber 11. An inner circumferential side of the exhaust duct 17 is open in a circumferential direction above the annular member 16, and the exhaust duct 17 may exhaust the atmosphere of the processing space 10 through a gap 18 formed between the cover member 23 and the ceiling plate 15 of the processing chamber 11. In the drawing, reference numeral 34 denotes an exhaust pipe having one end connected to the exhaust duct 17 and an other end connected to a vacuum exhaust pump 37 with a pressure regulator 35 and a valve 36 sequentially provided in the exhaust pipe 34 to regulate the amount of exhaust gas in order to control the vacuum pressure in the processing space 10.

The downstream ends of gas flow passages 41 and 61 are connected to the gas supply passages 31 and 32, respectively. An upstream end of the gas flow passage 41 is connected to a gas supply source 44 for a TiCl$_4$ gas, which is a processing gas, with a valve V1, a gas storage tank 42, and a flow regulator 43 sequentially provided in the gas flow passage 41. The flow regulator 43 is constituted by a mass flow controller and regulates the flow rate of the TiCl$_4$ gas supplied from the gas supply source 44 to the downstream side thereof. Furthermore, other flow regulators 47, 52, 63, 67, and 72, which will be described below, are also constituted similar to the flow regulator 43, and regulate the flow rates of gases supplied to the downstream sides of the flow passages.

The TiCl$_4$ gas supply source 44 is configured by a tank for storing TiCl$_4$ in a liquid state. The TiCl$_4$ in the tank is gasified by heating the tank, and the gasified TiCl$_4$ is supplied from the TiCl$_4$ gas supply source 44 to the gas flow passage 41. For the respective flow regulators, an appropriate flow regulator is used according to the temperature of the gas for which the flow rate is regulated. A flow regulator designed to regulate the flow rate of the TiCl$_4$ gas heated to a relatively high temperature is used as the flow regulator 43.

The gas storage tank 42 temporarily stores the TiCl$_4$ gas supplied from the gas supply source 44 before supplying the TiCl$_4$ gas into the processing chamber 11. After the internal pressure of the gas storage tank 42 is increased to a predetermined pressure by storing the TiCl$_4$ gas in the gas storage tank 42, the TiCl$_4$ gas is supplied from the gas storage tank 42 to the processing chamber 11. The supply and stoppage of the TiCl$_4$ gas from the gas storage tank 42 to the processing chamber 11 is performed by opening/closing the valve V1. By temporarily storing the TiCl$_4$ gas in the gas storage tank 42, it is possible to stably supply the TiCl$_4$ gas into the processing chamber 11 at a relatively high flow rate.

Similar to the gas storage tank 42, gas storage tanks 46, 62 and 66 to be described later are gas storage parts that serve to temporarily store respective gases supplied from gas supply sources at the upstream sides of gas flow passages, thereby stabilizing the flow rates of the respective gases to be supplied to the processing chamber 11. The supply and stoppage of the gases from the respective gas storage tanks 46, 62 and 66 to the processing chamber 11 is performed by opening/closing valves V2, V4, V5 and V6 installed at the downstream sides of the respective gas storage tanks 46, 62, and 66.

Returning to the description of the gas flow passage 41, a downstream end of a gas flow passage 45 is connected to the gas flow passage 41 at the downstream side of the valve V1. The upstream end of the gas flow passage 45 is connected to an N$_2$ gas supply source 48 with the valve V2, the gas storage tank 46, and a flow regulator 47 sequentially provided in the gas flow passage 45. Furthermore, a downstream end of a gas flow passage 51 is connected to the gas flow passage 45 at the downstream side of the valve V2. An upstream end of the gas flow passage 51 is connected to an N$_2$ gas supply source 53 with a valve V3 and the flow regulator 52 sequentially provided in the gas flow passage 51. An orifice 54 is formed in the gas flow passage 51 at the downstream side of the valve V3. Namely, a diameter of the gas flow passage 51 at the downstream side of the valve V3 is smaller than a diameter of the gas flow passage 51 at the upstream side of the valve V3, and is smaller than each diameter of the gas flow passages 41 and 45. Gases are supplied to the gas flow passages 41 and 45 at a relatively high flow rate by the gas storage tanks 42 and 46, and the orifice 54 prevents the gases supplied to the gas flow passages 41 and 45 from flowing backward along the gas flow passage 51.

The N$_2$ gas supplied from the N$_2$ gas supply source 48 to the gas flow passage 45 is supplied into the processing chamber 11 to perform the purge process already described above. The N$_2$ gas supplied from the N$_2$ gas supply source 53 to the gas flow passage 51 is the carrier gas for the TiCl$_4$ gas. Since this carrier gas is continuously supplied into the processing chamber 11, as described above, while the wafer W is being processed, the carrier gas is supplied into the processing chamber 11 even when the purge process is performed. Accordingly, the time period during which the carrier gas is supplied into the processing chamber 11 overlaps the time period during which the N$_2$ gas from the gas supply source 48 is supplied into the processing chamber 11 to perform the purge process, and thus the carrier gas is also used in the purge process. For the convenience of description, the gas supplied from the N$_2$ gas supply source 48 to the gas flow passage 45 is referred to as the purge gas, and the gas supplied from the N$_2$ gas supply source 53 to the gas flow passage 51 is referred to as the carrier gas. Furthermore, the carrier gas is also used as a gas for preventing the TiCl$_4$ gas from flowing backward along the gas flow passage 51.

Next, the gas flow passage 61, which is connected to the gas supply passage 32 of the processing chamber 11, will be described. An upstream side of the gas flow passage 61 branches into two flow passages, and thereafter the two flow passages join together again. The upstream end of the gas flow passage 61 is connected to a supply source 64 for an $NH_3$ gas, which is a processing gas, with the gas storage tank 62 and the flow regulator 63 sequentially provided in the gas flow passage 61. The gas flow passage 61 is a reaction gas flow passage and is formed independently of the gas flow passage 41 which is a source gas flow passage. Furthermore, the valves V4 and V5 are provided respectively in the branched portions of the gas flow passage 61, as described above. The branched gas flow passages are formed at the downstream side of the gas storage tank 62 to increase conductance to supply a relatively large amount of the $NH_3$ gas to the processing chamber 11.

A downstream end of a gas flow passage 65 is connected at the downstream side of the valve V5 in the branched portion of the gas flow passage 61. An upstream end of the gas flow passage 65 is connected to an $N_2$ gas supply source 68 with the valve V6, the gas storage tank 66, and the flow regulator 67 sequentially provided in the gas flow passage 65. Furthermore, a downstream end of a gas flow passage 71 is connected to the gas flow passage 65 at the downstream side of the valve V6. An upstream end of the gas flow passage 71 is connected to an $N_2$ gas supply source 73 with a valve V7 and the flow regulator 72 sequentially provided in the gas flow passage 71. An orifice 74 is formed in the gas flow passage 71 at the downstream side of the valve V7. A diameter of the gas flow passage 71 at the downstream side of the valve V7 is smaller than a diameter of the gas flow passage 71 at the upstream side of the valve V7, and is smaller than each diameter of the gas flow passages 61 and 65. Similar to the orifice 54, the orifice 74 is formed to prevent gases supplied to the gas flow passages 61 and 65 at a relatively high flow rate from flowing backward along the gas flow passage 71.

The $N_2$ gas supplied from the $N_2$ gas supply source 68 to the gas flow passage 65 is supplied into the processing chamber 11 in order to perform the purge process already described above. The $N_2$ gas supplied from the $N_2$ gas supply source 73 to the gas flow passage 71 is a carrier gas for the $NH_3$ gas and is also used in the purge process, similarly to the carrier gas for the $TiCl_4$ gas. For the convenience of description, the gas supplied from the $N_2$ gas supply source 68 to the gas flow passage 65 is referred to as a purge gas, and the gas supplied from the $N_2$ gas supply source 73 to the gas flow passage 71 is referred to as a carrier gas. Furthermore, the carrier gas is also used as a gas for preventing the $NH_3$ gas from flowing backward along the gas flow passage 71.

The respective gas flow passages are formed as described above. Accordingly, the gas flow passage 51 serving as a first carrier gas flow passage has the valve V3 and the flow regulator 52 as devices for controlling the supply of a carrier gas, and the gas flow passage 45 serving as a first substitution gas flow passage has the valve V2 and the flow regulator 47 installed thereon as devices for controlling the supply of a purge gas, wherein the valve V2 and the flow regulator 47 are separate from the valve V3 and the flow regulator 52. Furthermore, the gas flow passage 71 serving as a second carrier gas flow passage has the valve V7 and the flow regulator 72 as devices for controlling the supply of a carrier gas, and the gas flow passage 65 serving as a second substitution gas flow passage has the valve V6 and the flow regulator 67 installed thereon as devices for controlling the supply of a purge gas, wherein the valve V6 and the flow regulator 67 are separate from the valve V7 and the flow regulator 72.

As described above, the purge gases are supplied to the processing chamber 11 from both the gas flow passages 45 and 65. This serves to purge the remaining $TiCl_4$ gas in the gas flow passage 41 at the downstream side of the valve V1 and the remaining $NH_3$ gas in the gas flow passage 61 at the downstream side of the valves V4 and V5, as well as to purge the $TiCl_4$ gas and the $NH_3$ gas that remain in the processing chamber 11. Namely, the two purge gas flow passages are formed to purge the $TiCl_4$ gas and the $NH_3$ gas more assuredly.

The film forming apparatus 1 includes a controller 100. The controller 100 is constituted by a computer and includes a program, memory, and a CPU. The program has a group of steps therein to perform a series of operations, which will be described below, in the film forming apparatus 1, and the controller 100 outputs control signals to the respective parts of the film forming apparatus 1 by means of the program to control the operation of the respective parts. Specifically, operations, such as opening/closing the valves V1 to V7, regulating the flow rates of gases by the flow regulators 43, 47, 52, 63, 67 and 72, regulating the internal pressure of the processing chamber 11 by the pressure regulator 35, adjusting the temperature of the wafer W by the heater 22, and the like, are controlled by the control signals. The program is stored in a storage medium, such as a flexible disc, a compact disc, a hard disc, a magneto-optical disc, or the like, and is installed in the controller 100. The gas supply apparatus according to the present disclosure is constituted by the controller 100, the gas flow passages 41, 45, 51, 61, 65 and 71, the gas supply sources 44, 48, 53, 64, 68 and 73, the valves V1 to V7, the flow regulators 43, 47, 52, 63, 67 and 72, and the gas storage tanks 42, 46, 62 and 66.

Hereinafter, a film forming process in the film forming apparatus 1 will be described with reference to FIGS. 2 to 5 illustrating the open/closed states of the respective valves and the flow state of gases in the respective gas flow passages. In FIGS. 2 to 5, the closed valves V are distinguished from the open valves V by hatching drawn on the closed valves. The portion of each gas flow passage in which the gas flows toward the downstream side is shown by a thicker line than the portion of the gas flow passage in which no gas flows. The processing chamber 11 and the respective parts within the processing chamber 11 are schematically illustrated in FIGS. 2 to 5, compared with FIG. 1. Furthermore, it will also be appropriate to refer to the timing chart of FIG. 6 in the following description of the film forming process. In the timing chart of FIG. 6, time periods during which a $TiCl_4$ gas, an $NH_3$ gas, a carrier gas, and a purge gas flow are denoted by rectangular regions with different gray-scale levels, respectively. The height of each rectangular region corresponds to the amount of gas supplied into the processing chamber 11. When a rectangular region has a greater height, it means that a larger amount of gas is supplied into the processing chamber 11.

First, a wafer W is transferred into the processing chamber 11 and loaded on the susceptor 21 in the transfer position by the transfer mechanism in the state in which the valves V1 to V7 are closed. The transfer mechanism retreats from the inside of the processing chamber 11, and thereafter the gate valve 13 is closed. The susceptor 21 moves up to the processing position to form the processing space 10 while the wafer W is being heated to, for example, 460 degrees C. by the heater 22 in the susceptor 21. The internal pressure of the processing chamber 11 is adjusted to a predetermined vacuum pressure by the pressure regulator 35 provided in the exhaust pipe 34. The valves V3 and V7 are opened, and a carrier gas ($N_2$ gas) of, for example, 500 sccm is supplied from the $N_2$ gas supply sources 53 and 73 to the respective gas flow passages 51 and 71. That is, a carrier gas of 1,000 sccm is supplied into the processing chamber 11. A $TiCl_4$ gas and an $NH_3$ gas are supplied from the gas supply sources 44 and 64 to the gas flow passages 41 and 61, respectively. Since the valves V1, V4, and V5 have been closed, the $TiCl_4$ gas and the $NH_3$ gas are stored in the gas storage tanks 42 and 62, respectively, and thus the internal pressure of the gas storage tanks 42 and 62 increases.

Thereafter, the valve V1 is opened (at time t1 in the chart), and the $TiCl_4$ gas stored in the gas storage tank 42 is supplied into the processing chamber 11 and adsorbed onto the surface of the wafer W. While the $TiCl_4$ gas is being supplied into the processing chamber 11, the purge gas ($N_2$ gas) is supplied from the gas supply sources 48 and 68 to the respective gas flow passages 45 and 65. Since the valves V2 and V6 have been closed, the purge gas is stored in the gas storage tanks 46 and 66, and thus the internal pressure of the gas storage tanks 46 and 66 increases (Step S1 in FIG. 2).

When, for example, 0.05 seconds have elapsed from time t1, the valve V1 is closed, and the valves V2 and V6 are opened (at time t2). Accordingly, the supply of the $TiCl_4$ gas into the processing chamber 11 is stopped, and the purge gas stored in the gas storage tanks 46 and 66 is supplied into the processing chamber 11. Since the purge gas is supplied from the gas storage tanks 46 and 66, of which the internal pressure has increased as described above, the purge gas is supplied into the processing chamber 11 at a relatively high flow rate, for example, at a flow rate of 1,500 sccm to 5,000 sccm which is higher than the flow rate of the carrier gas. Thus, the $TiCl_4$ gas remaining in the processing chamber 11 is rapidly purged through the exhaust pipe 34, and the $TiCl_4$ gas atmosphere in the processing chamber 11 is replaced by an $N_2$ gas atmosphere. While the purge process is performed in this way, the valve V1 has been closed such that the $TiCl_4$ gas supplied from the gas supply source 44 to the gas flow passage 41 is stored in the gas storage tank 42, and thus the internal pressure of the gas storage tank 42 increases (Step S2 in FIG. 3).

When, for example, 0.2 seconds have elapsed from time t2, the valves V2 and V6 are closed, and the valves V4 and V5 are opened (at time t3). Accordingly, the supply of the purge gas into the processing chamber 11 is stopped, and the $NH_3$ gas stored in the gas storage tank 62 is supplied into the processing chamber 11 and reacts with the $TiCl_4$ gas adsorbed onto the surface of the wafer W, thereby forming an atomic layer of TiN which is a reaction product. Since the valves V2 and V6 are closed, the purge gas supplied from the gas supply sources 48 and 68 to the gas flow passages 45 and 65 is stored in the respective gas storage tanks 46 and 66, and thus the internal pressure of the gas storage tanks 46 and 66 increases (Step S3 in FIG. 4).

When, for example, 0.3 seconds have elapsed from time t3, the valves V4 and V5 are closed, and the valves V2 and V6 are opened (at time t4). Accordingly, the supply of the $NH_3$ gas into the processing chamber 11 is stopped, and the purge gas stored in the respective gas storage tanks 46 and 66 is supplied into the processing chamber 11. Since the purge gas is supplied from the gas storage tanks 46 and 66, of which the internal pressure has increased as described above, the purge gas is supplied into the processing chamber 11 at a flow rate of, for example, 1,500 sccm to 5,000 sccm. Thus, the $NH_3$ gas remaining in the processing chamber 11 is rapidly purged through the exhaust pipe 34, and the $NH_3$ gas atmosphere in the processing chamber 11 is replaced with an $N_2$ gas atmosphere. While the purge process is performed in this way, the valves V4 and V5 have been closed such that the $NH_3$ gas supplied from the gas supply source 64 to the gas flow passage 61 is stored in the gas storage tank 62, and thus the internal pressure of the gas storage tank 62 increases (Step S4 in FIG. 5).

When, for example, 0.3 seconds have elapsed from time t4, the valves V2 and V6 are closed, and the valve V1 is opened (at time t5). Accordingly, the supply of the purge gas into the processing chamber 11 is stopped, and the $TiCl_4$ gas stored in the gas storage tank 42 is supplied into the processing chamber 11. That is, the step S1 is performed again. Therefore, the time t5 when the purge process ends corresponds to the time t1 when the supply of the $TiCl_4$ gas starts. After step S1 is performed, steps S2 to S4 are performed, and thereafter steps S1 to S4 are performed again. That is, a cycle including steps S1 to S4 is repeatedly performed to accumulate an atomic layer of TiN on the surface of the wafer W, thereby forming a TiN film. After the cycle is performed a predetermined number of times, the wafer W is unloaded from the processing chamber 11 in the reverse order to that in which the wafer W is loaded in the processing chamber 11.

In the film forming apparatus 1, the gas flow passages 45 and 65 for supplying the purge gas into the processing chamber 11 are provided with the flow regulators 47 and 67 and the valves V2 and V6, which are different from the flow regulators 52 and 72 and the valves V3 and V7 provided in the gas flow passages 51 and 71 for supplying the carrier gas for the $TiCl_4$ gas and the $NH_3$ gas. Further, the purge gas flow passages 45 and 65 are provided with the gas storage tanks 46 and 66, respectively, which store the purge gas therein to increase the internal pressure of thereof and then supply the stored purge gas to the processing chamber 11 by opening and closing the valves V2 and V6. Accordingly, it is possible to rapidly replace the atmosphere in the processing chamber 11 by supplying the purge gas into the processing chamber 11 at a relatively high flow rate. This may help to increase the throughput. Furthermore, it is possible to suppress an increase in the flow rate of the carrier gas by replacing the atmosphere in the processing chamber 11 with the purge gas, the flow rate of which is controlled independently of the flow rate of the carrier gas. Therefore, it is possible to suppress an increase in the flow rate of the $TiCl_4$ gas required to form a film having the good step coverage, whereby the adhesion of the $TiCl_4$ gas to the gas flow passage 41 can be suppressed, and the frequency of maintenance can be reduced. In a different point of view, a TiN film having the good step coverage can be formed by increasing the flow rate of the $TiCl_4$ gas supplied to the processing chamber 11 to increase the partial pressure of the $TiCl_4$ gas in the processing chamber 11, to the extent in which the adhesion of the $TiCl_4$ gas to the gas flow passage 41 can be sufficiently suppressed.

It has been described above that the purge gas is supplied into the processing chamber 11 at a relatively high flow rate in the film forming process. However, similar to the purge gas, the $TiCl_4$ gas and the $NH_3$ gas are supplied into the processing chamber 11 at a relatively high flow rate since the $TiCl_4$ gas and the $NH_3$ gas are also stored in the respective gas storage tanks 42 and 62 and are then supplied into the processing chamber 11. Therefore, it is possible to reduce the time periods during which the $TiCl_4$ gas and the $NH_3$ gas are supplied into the processing chamber 11, thereby more assuredly enhancing the throughput.

The gas flow passages 45 and 65 for the purge gas have been described as being connected to the gas flow passages 41 and 61 for supplying the TiCl$_4$ gas and the NH$_3$ gas, respectively. However, without being limited thereto, for example, the purge gas flow passages 45 and 65 may be connected to a gas supply passage that is installed in the ceiling plate 15 of the processing chamber 11 independently of the gas supply passages 31 and 32 and that is for supplying gas into the processing chamber 11. Furthermore, in this case, it is not limited to install the two gas flow passages 45 and 65. However, one of the gas flow passages 45 and 65 may be installed. However, in order to perform a purge process on the gas flow passages 41 and 61 as described above, it is preferable to provide the two purge gas flow passages 45 and 65 to be connected to the gas flow passages 41 and 61, respectively. Moreover, the carrier gas flow passage and the purge gas flow passage are preferable to supply the gases to the downstream sides through the supply control devices different from each other. Accordingly, for example, the upstream side of the flow regulator 47 on the flow passage 45 for the purge gas and the upstream side of the flow regulator 52 on the gas flow passage 51 for the carrier gas may join together and may then be connected to a common N$_2$ gas supply source.

In addition, the present disclosure is not limited to forming the TiN film, but may also be used to form, for example, a tungsten nitride (WN) film. In this case, for example, a tungsten chloride gas is used as a source gas, and, for example, an NH$_3$ gas is used as a reaction gas. Furthermore, in the formation of the TiN film or the WN film, a nitrogen containing gas (for example, hydrazine, etc.), other than the NH$_3$ gas, may be used to nitrify the source gas. As described above, the present disclosure may be appropriately modified, and is not limited to the above-described embodiment.

(Evaluation Test)

Hereinafter, evaluation tests conducted in relation to the present disclosure will be described.

Evaluation Test 1

In Evaluation Test 1, TiN films were formed on a plurality of wafers W using the film forming apparatus 1, as described above with reference to FIGS. 2 to 6. Test wafers W having the longitudinal section illustrated in FIG. 7 were used as the wafers W on which the films were formed. Each test wafer W had a recess 81 formed thereon. The recess 81 had a diameter of 20 nm and an aspect ratio of 50.

The process conditions in Evaluation Test 1 were as follows. During the film forming processes, the wafers W were maintained at a temperature of 530 degrees C. The time period of each step S was the same as that of each step S in the aforementioned film forming process, and the flow rate of the carrier gas supplied into the processing chamber 11 was set to 1,000 sccm, which is the same as the flow rate of the carrier gas supplied into the processing chamber 11 in the aforementioned film forming process. Further, the flow rate of the TiCl$_4$ gas supplied to the processing chamber 11 in step S1 and the flow rate of the purge gas supplied to the processing chamber 11 in steps S2 and S4 were varied according to the wafers W. More specifically, the flow rate of the TiCl$_4$ gas was set to 140 sccm or 200 sccm in the film forming processes. The flow rate of the TiCl$_4$ gas was set to 140 sccm in Evaluation Test 1-1 and 200 sccm in Evaluation Test 1-2. The flow rate of the purge gas was selectively set to one of 3,000 sccm, 6,000 sccm, and 10,000 sccm.

After a TiN film 82 was formed on the recess 81, the following Equation 1 was calculated. Thereafter, the value obtained by calculating the Equation 1 was considered to be a step coverage value (unit: %). An increase in the step coverage value implies an increase in the coverage of the TiN film 82 for the surface of the wafer W.

$$\text{Step Coverage} = (\text{Thickness } t1 \text{ of the TiN film formed on a lower end portion of a sidewall of the recess 81/Thickness } t2 \text{ of the TiN film formed on an upper end portion of a sidewall of the recess 81)} \times 100 \quad \text{[Equation 1]}$$

Figure 8:
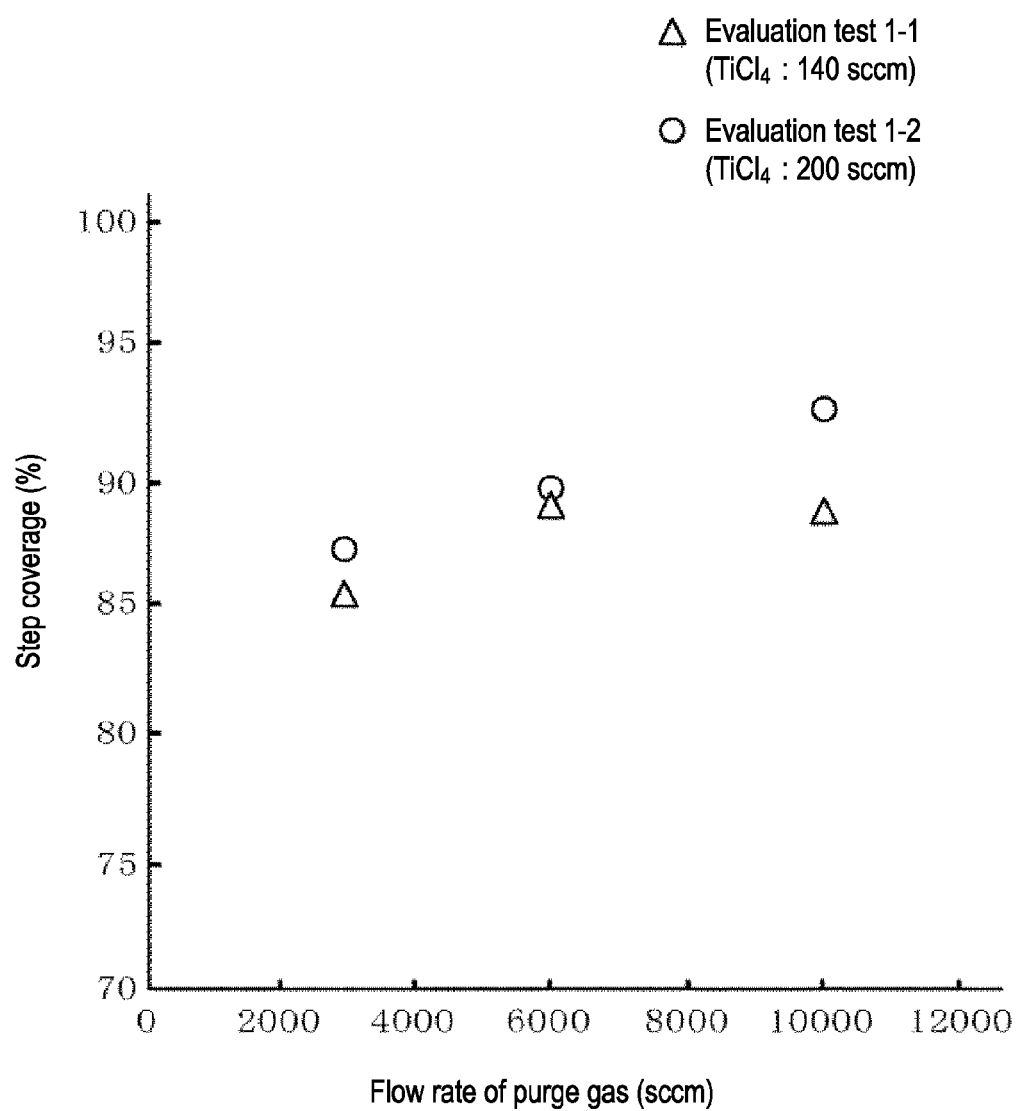
FIG. 8 is a graph depicting the results of the evaluation test.

FIG. 8 is a graph depicting the results of Evaluation Test 1. The horizontal axis of the graph represents the flow rate (unit: sccm) of the purge gas supplied into the processing chamber 11 in steps S2 and S4, and the vertical axis of the graph represents the step coverage (unit: %). The results of Evaluation Test 1-1 are plotted as triangles on the graph, and the results of Evaluation Test 1-2 are plotted as circles on the graph. As illustrated in the graph, the step coverage values in Evaluation Test 1-2 were higher than the step coverage values in Evaluation Test 1-1 in all cases where the flow rate of the purge gas was 3,000 sccm, 6,000 sccm, or 10,000 sccm.

In Evaluation Test 1-1, the step coverage values when the flow rate of the purge gas was 6,000 sccm and 10,000 sccm were higher than that when the flow rate of the purge gas was 3,000 sccm. In Evaluation Test 1-2, the step coverage value increased as the flow rate of the purge gas increased. Accordingly, it can be seen that a good step coverage could be obtained when the purge gas was supplied into the processing chamber 11 at a relatively high flow rate. The graph shows that the step coverage was about 90% or more, which is a sufficient value for practical application, when the flow rate of the purge gas was 6,000 sccm or more. Therefore, it is preferable that the flow rate of the purge gas be, for example, 6,000 sccm.

Figure 6:
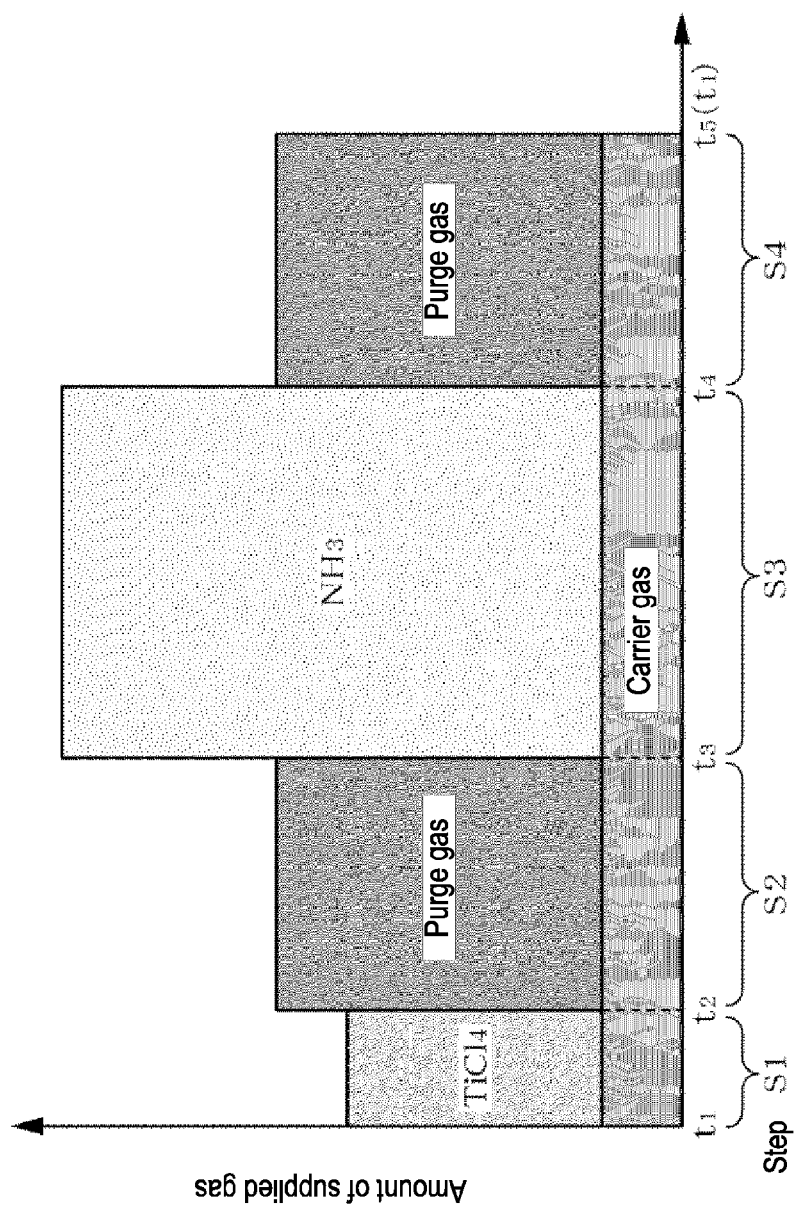
FIG. 6 is a timing chart illustrating the variations in the amounts of supplied gases in the processes conducted by the film forming apparatus.
Figure 9:
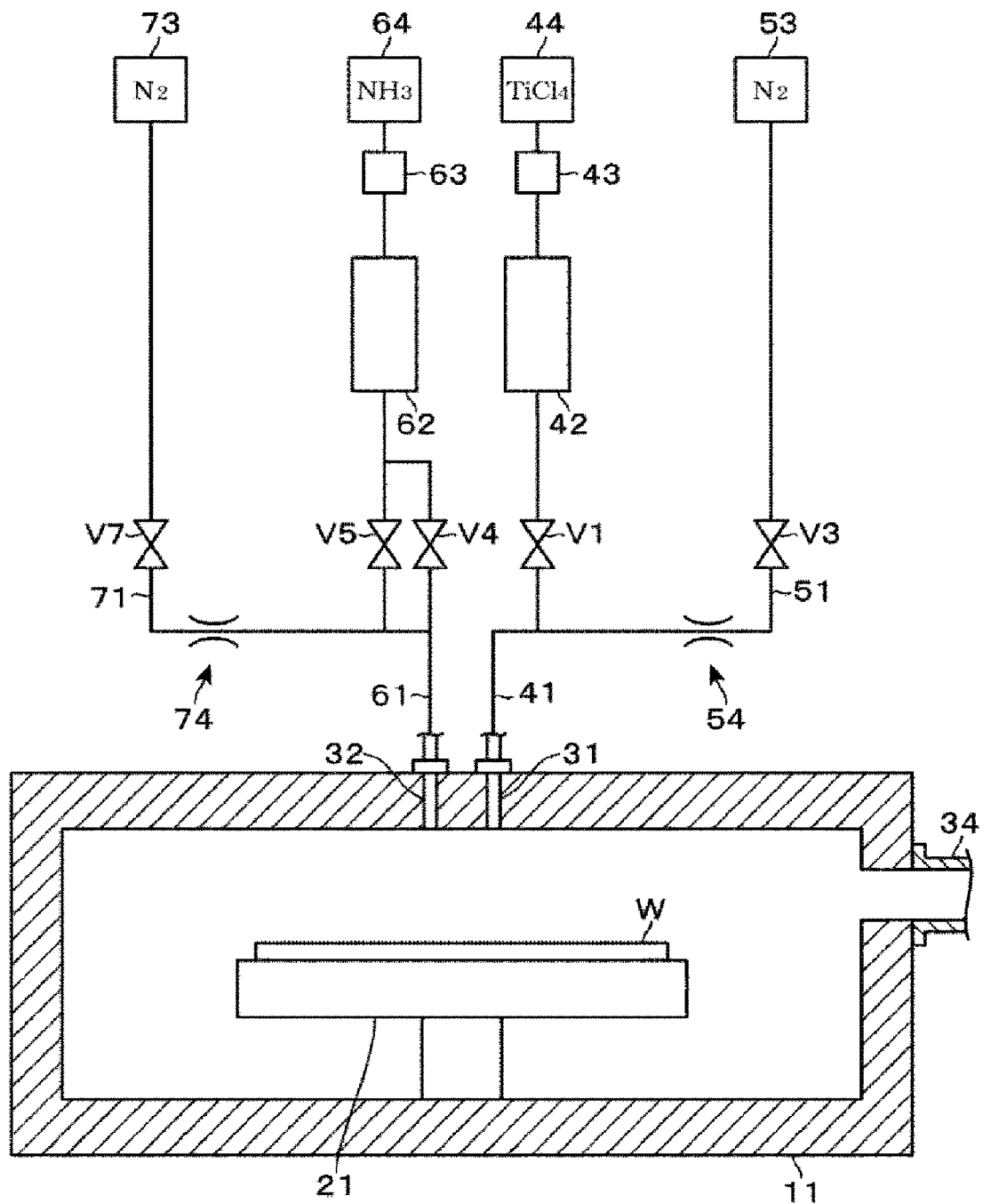
FIG. 9 is a schematic longitudinal sectional view of a film forming apparatus according to a comparative example.
Figure 10:
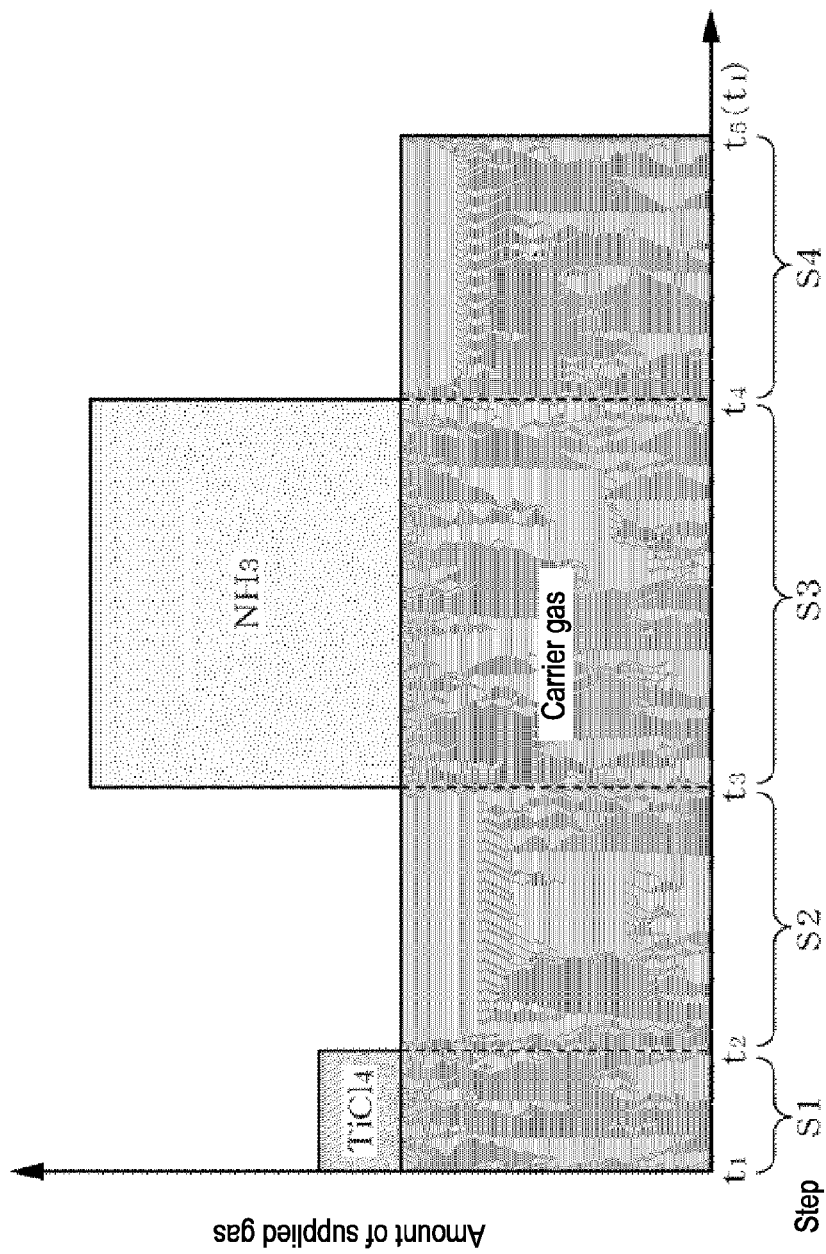
FIG. 10 is a timing chart illustrating the variation in the amounts of supplied gases in processes conducted by the film forming apparatus according to the comparative example.

Furthermore, a TiN film was formed using the film forming apparatus 8 illustrated in FIG. 9, and Comparative Test 1 was conducted to measure the step coverage of the TiN film. The film forming apparatus 8 was constituted to be similar to the film forming apparatus 1, except that the gas flow passages 45 and 65 for supplying a purge gas were not installed in the film forming apparatus 8. Accordingly, in steps S2 and S4 executed by the film forming apparatus 8, no purge gas was supplied from the gas flow passages 45 and 65, and the purge process was performed by a carrier gas supplied to the gas flow passages 51 and 71. Similar to FIG. 6, FIG. 10 is a timing chart illustrating the amounts of gases supplied into the processing chamber 11 in the film forming apparatus 8. As clearly shown by comparing the chart of FIG. 10 and the chart of FIG. 6, the film forming apparatus 8 was set to supply a larger amount of the carrier gas. This was because the purge process was performed by the carrier gas. Furthermore, the processing chamber 11 of the film forming apparatus 8 was constituted to be similar to the processing chamber 11 of the film forming apparatus 1, and is schematically illustrated in FIG. 9, as similar FIG. 2. In Comparative Test 1 using the film forming apparatus 8, the flow rate of the carrier gas supplied into the processing chamber 11 in steps S1 to S4 was set to 4,000 sccm, and the flow rate of the TiCl$_4$ gas supplied into the processing chamber 11 in step S1 was set to 140 sccm. The other process conditions were the same as those in Evaluation Test 1.

The step coverage obtained in Comparative Test 1 was 78%. As illustrated in the graph of FIG. 8, each step coverage value obtained in Evaluation Tests 1-1 and 1-2 was 85% or more, which exceeds 78%. Accordingly, the coverage of the TiN film for the wafer W in Evaluation Test 1 was higher than that in Comparative Test 1, and thus the effect of the present disclosure was confirmed.

Evaluation Test 2

Figure 7:
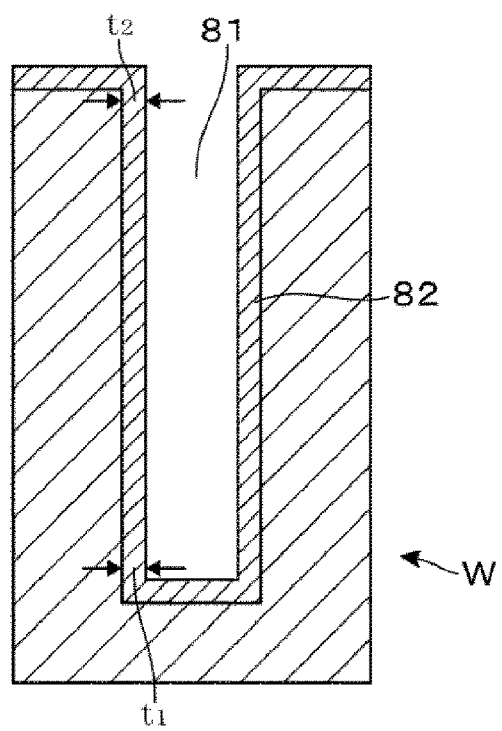
FIG. 7 is a longitudinal sectional view of a wafer used in an evaluation test.

In Evaluation Test 2, the film forming process was performed on each of a plurality of wafers W shown in FIG. 7, as similar Evaluation Test 1, and step coverage values were measured. However, the flow rate of the carrier gas supplied into the processing chamber 11 in steps S1 to S4 and the flow rate of the $TiCl_4$ gas supplied into the processing chamber 11 in step S1 were varied according to the wafers W. The flow rate of the carrier gas was set to either 1,000 sccm or 500 sccm. The flow rate of the carrier gas was set to 1,000 sccm in Evaluation Test 2-1 and 500 sccm in Evaluation Test 2-2. In Evaluation Test 2-1, the flow rate of the $TiCl_4$ gas was set to 50 sccm, 100 sccm, 140 sccm, and 200 sccm. In Evaluation Test 2-2, the flow rate of the $TiCl_4$ gas was set to 50 sccm, 100 sccm, and 140 sccm. The flow rate of the purge gas supplied into the processing chamber 11 in steps S2 and S4 of Evaluation Test 2 was set to 6,000 sccm. The other process conditions were set similarly to those in Evaluation Test 1.

Figure 11:
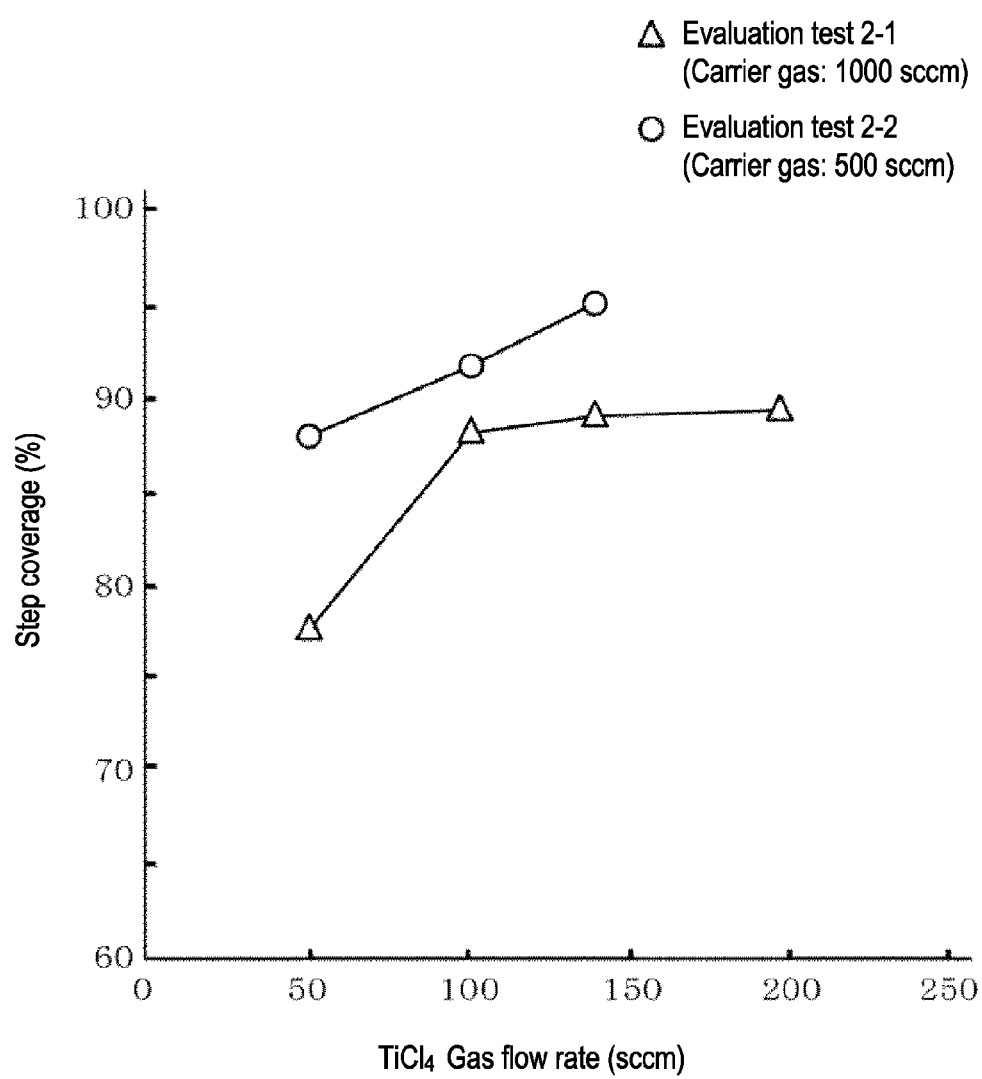
FIGS. 11 to 15 are graphs depicting the results of an evaluation test.

FIG. 11 is a graph depicting the results of Evaluation Test 2. The horizontal axis of the graph represents the flow rate of the $TiCl_4$ gas, and the vertical axis of the graph represents the step coverage. The results of Evaluation Test 2-1 are plotted as triangles on the graph, and the results of Evaluation Test 2-2 are plotted as circles on the graph. As clearly shown in the graph, if the flow rate of the $TiCl_4$ gas was same between the Evaluation Tests 2-1 and 2-2, the step coverage in Evaluation Test 2-2, in which the carrier gas was supplied at a lower flow rate, was higher than the step coverage in Evaluation Test 2-1. Furthermore, the graph shows that the step coverage was increased as the flow rate of the $TiCl_4$ gas was increased in Evaluation Tests 2-1 and 2-2. The results of Evaluation Tests 1 and 2 show that the good step coverage was obtained by increasing the flow rate of the $TiCl_4$ gas with respect to the flow rate of the carrier gas in step S1. In addition, each step coverage value measured in Evaluation Test 2 was higher than 78%, which is the step coverage value measured in Comparative Test 1. Namely, it was confirmed that step coverage better than the step coverage in Comparative Test 1 was obtained if the flow rate of the carrier gas supplied to the processing chamber 11 was 1,000 sccm or less when the film formation is performed by the film forming apparatus 1.

Evaluation Test 3

In Evaluation Test 3, TiN films were formed on a plurality of wafers W by performing film forming processes using the film forming apparatus 1, and the film thicknesses (unit: Å) and specific resistances (μΩ·cm) of the TiN films were measured. In Evaluation Test 3, the processes were performed by setting the flow rate of the carrier gas supplied to the processing chamber 11 to 1,000 sccm and varying the flow rate of the purge gas in the range of 500 sccm to 10,000 sccm according to the wafers W. The temperature of the wafers W during the film forming processes was set to 460 degrees C. The amount of the $TiCl_4$ gas supplied into the processing chamber 11 in one cycle was set to 1.05 cc. The amount of the $NH_3$ gas supplied into the processing chamber 11 in one cycle was set to 38 cc. The time periods during which steps S1 to S4 were performed were set to 0.05 seconds, 0.1 seconds, 0.13 seconds, and 0.1 seconds, respectively. The number of cycles was set to 300.

In Comparative Test 3, TiN films were formed on a plurality of wafers W by performing film forming processes using the film forming apparatus 8 as similar Comparative Test 1, and the film thicknesses and specific resistances of the TiN films were measured as similar Evaluation Test 3. In Comparative Test 3, the flow rate of the carrier gas was varied in the range of 2,000 sccm to 7,500 sccm according to the wafers W. The temperature of the wafers W, the amount of the $TiCl_4$ gas supplied into the processing chamber 11 in one cycle, the amount of the $NH_3$ gas supplied into the processing chamber 11 in one cycle, the time periods during which steps S1 to S4 were performed, and the number of cycles were set in the same manner as in Evaluation Test 3.

When the atmosphere around the wafer W was not sufficiently replaced in steps S2 and S4 in the state in which the $TiCl_4$ gas and the $NH_3$ gas were sufficiently supplied into the processing chamber 11 in steps S1 and S3, respectively, the film formation by Chemical Vapor Deposition (CVD) is also performed as well as the film formation by the ALD, and thus the film thickness was greater than that when the film forming process was performed only by the ALD. When the film forming process was performed by CVD in this way, the film quality was degraded, and thus the specific resistance of the TiN film is increased. Therefore, it is preferable that the film thickness and specific resistance of a TiN film be made smaller in Evaluation Test 3 and Comparative Test 3.

Figure 12:
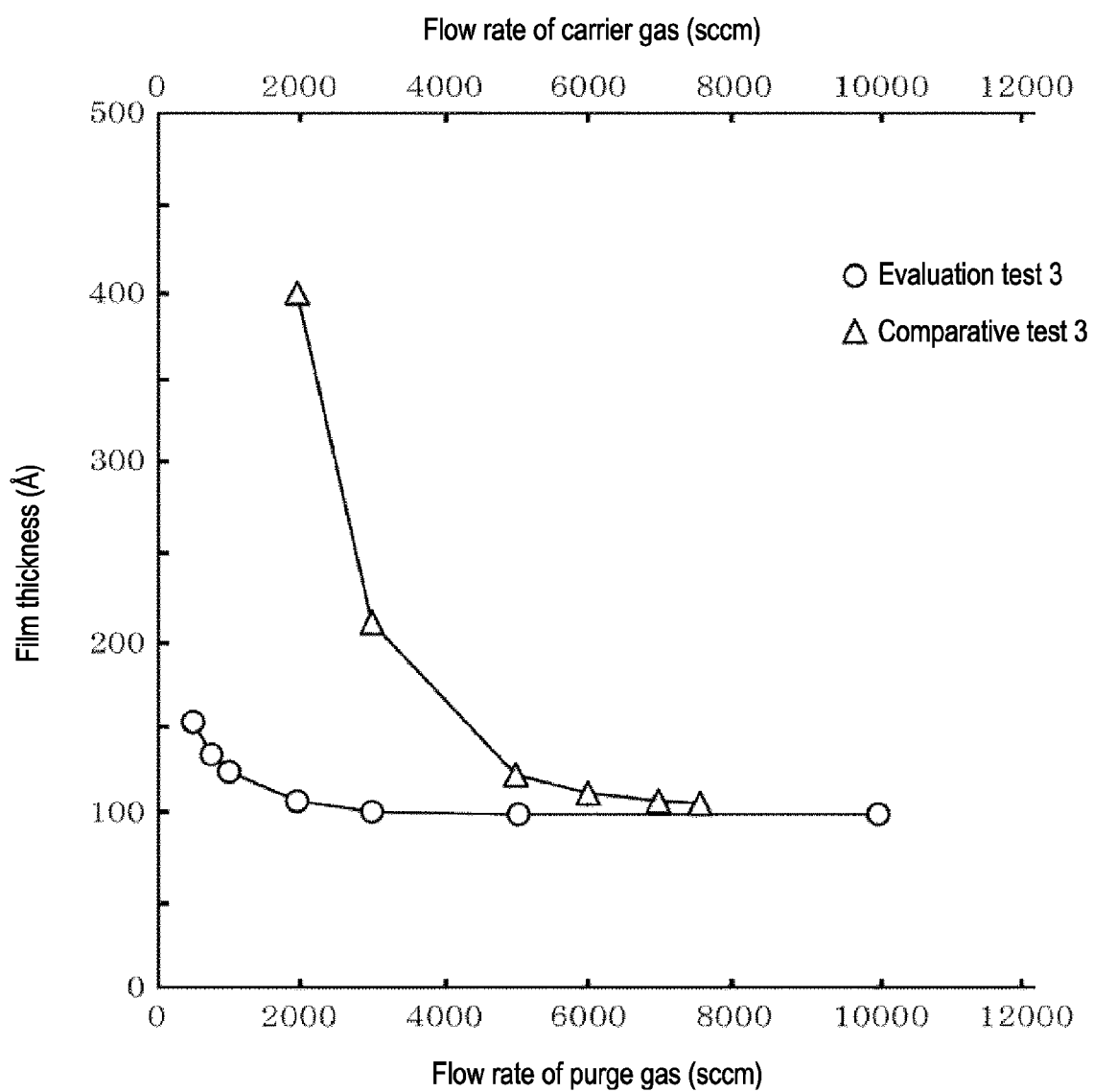
Figure 13:
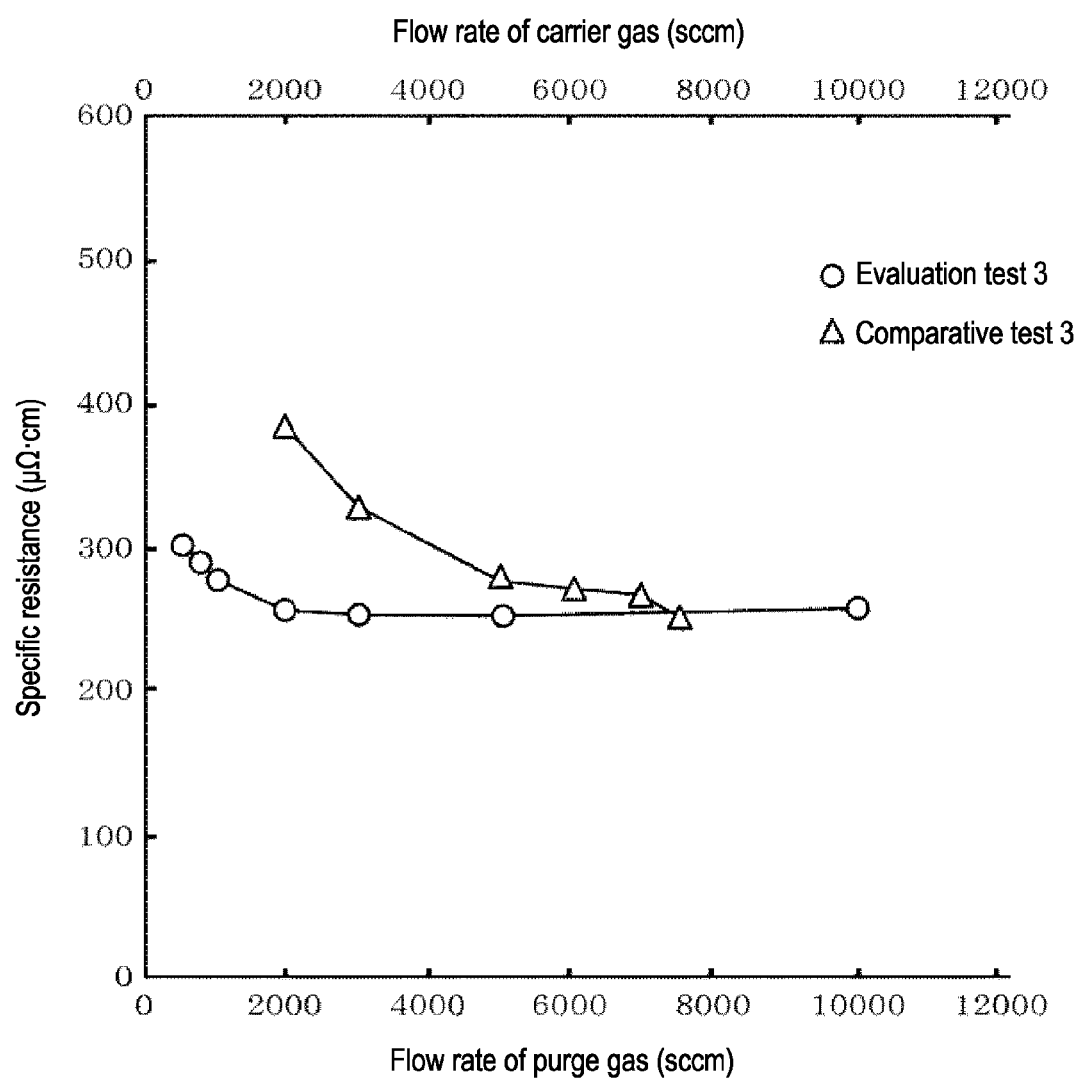

FIGS. 12 and 13 are graphs illustrating the results of Evaluation Test 3 and Comparative Test 3. In FIGS. 12 and 13, the horizontal axes of each graph represent the flow rate (unit: sccm) of the purge gas in Evaluation Test 3 and the flow rate (unit: sccm) of the carrier gas in Comparative Test 3. The vertical axis of the graph in FIG. 12 represents the measured film thickness (unit: Å), and the vertical axis of the graph in FIG. 13 represents the measured specific resistance (μΩ·cm). The results of Comparative Test 3 are plotted as triangles on the graph, and the results of Evaluation Test 3 are plotted as circles on the graph. As illustrated in the graphs, in Evaluation Test 3, the TiN films had a film thickness of about 100 Å to about 150 Å and a specific resistance of about 250 μΩ·cm to about 300 μΩ·cm.

When the flow rate of the purge gas was less than 2,000 sccm, the film thickness and the specific resistance are decreased as the flow rate of the purge gas is increased, and when the flow rate of the purge gas was in the range of 2,000 sccm to 10,000 sccm, the film thickness remained at about 100 Å, and the specific resistance remained at about 260 μΩ·cm. Accordingly, it is considered that no film forming process by CVD was induced when the flow rate of the purge gas was in the range of 2,000 sccm to 10,000 sccm. As illustrated in the graphs of FIGS. 12 and 13, in Comparative Test 3, the TiN films had a film thickness of about 100 Å to about 400 Å and a specific resistance of about 240 μΩ·cm to about 390 μΩ·cm. As the flow rate of the carrier gas is increased, the film thickness and the specific resistance are decreased.

The film thickness and the specific resistance when the flow rate of the purge gas was 500 sccm in Evaluation Test 3 were approximately the same as those when the flow rate of the carrier gas was 4,000 sccm in Comparative Test 3. The film thickness and the specific resistance when the flow rate of the purge gas was 1,000 sccm in Evaluation Test 3 were approximately the same as those when the flow rate of the carrier gas was 5,000 sccm in Comparative Test 3. Furthermore, the film thickness and the specific resistance when the flow rate of the purge gas was 3,000 sccm in Evaluation Test 3 were approximately the same as those when the flow rate of the carrier gas was 7,500 sccm in Comparative Test 3. Since the flow rate of the carrier gas was set to 1,000 sccm in Evaluation Test 3 as described above, it was confirmed from the experimental results that performing the process by means of the film forming apparatus 1 made it possible to restrict the flow rate of the carrier gas to a low value, in order to obtain the same TiN film thickness and specific resistance in the process by means of the film forming apparatus 1 and in the process by means of the film forming apparatus 8. As described in Evaluation Tests 1 and 2, since it was possible to obtain the good step coverage by increasing the flow rate of the $TiCl_4$ gas with respect to the flow rate of the carrier gas, it was confirmed from Evaluation Test 3 that the good step coverage can be obtained by performing a process by means of the film forming apparatus 1.

Evaluation Test 4

In Evaluation Test 4, TiN films were formed on a plurality of wafers W using the film forming apparatus 1 as similar Evaluation Test 3, and the film thicknesses (unit: Å) and the specific resistances ($\mu\Omega\cdot cm$) of the TiN films were measured. However, various process conditions were modified from the process conditions of Evaluation Test 3. In Evaluation Test 4, the flow rate of the $TiCl_4$ gas was set to 300 sccm, the amount of the supplied $NH_3$ gas per cycle was set to 38 cc, the temperature of the wafers W was set to 460 degrees C., the internal pressure of the processing chamber 11 was set to 5 Torr ($6.67 \times 10^2$ Pa), the flow rate of the carrier gas supplied to the respective gas flow passages 51 and 71 was set to 1,000 sccm, the flow rate of the purge gas supplied to the respective gas flow passages 45 and 65 was set to 10 slm, the time period during which step S1 was performed was set to 0.02 seconds, and the time period during which step S3 was performed was set to 0.13 seconds. Furthermore, in Evaluation Test 4, the time period during which step S2 or S4 was performed, namely, the time period performing one purge was varied according to the wafers W. Moreover, the time period during which step S2 was performed on one wafer W was the same as the time period during which step S4 was performed on the wafer W.

In Comparative Test 4, TiN films were formed on a plurality of wafers W using the film forming apparatus 8 as similar Comparative Test 3, and the film thicknesses and the specific resistances of the TiN films were measured. However, various process conditions other than the flow rate of the carrier gas were set as similar Evaluation Test 4. The flow rate of the carrier gas supplied to the respective gas flow passages 51 and 71 was set to 10 slm. Even in Comparative Test 4, the time periods during which steps S2 and s4 were performed were varied according to the wafers W as in Evaluation Test 4. Namely, the time period performing one purge performed by the carrier gas was varied according to the wafers W.

Figure 14:
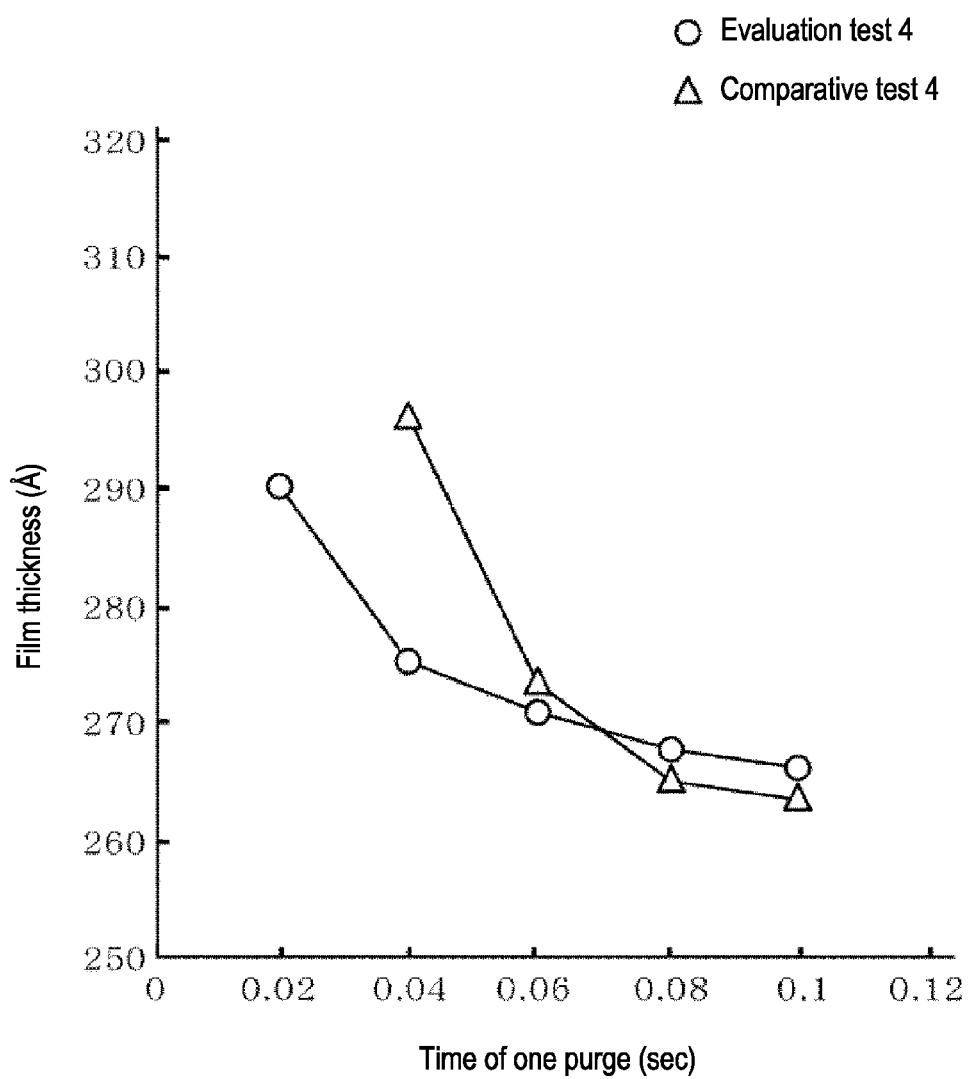
Figure 15:
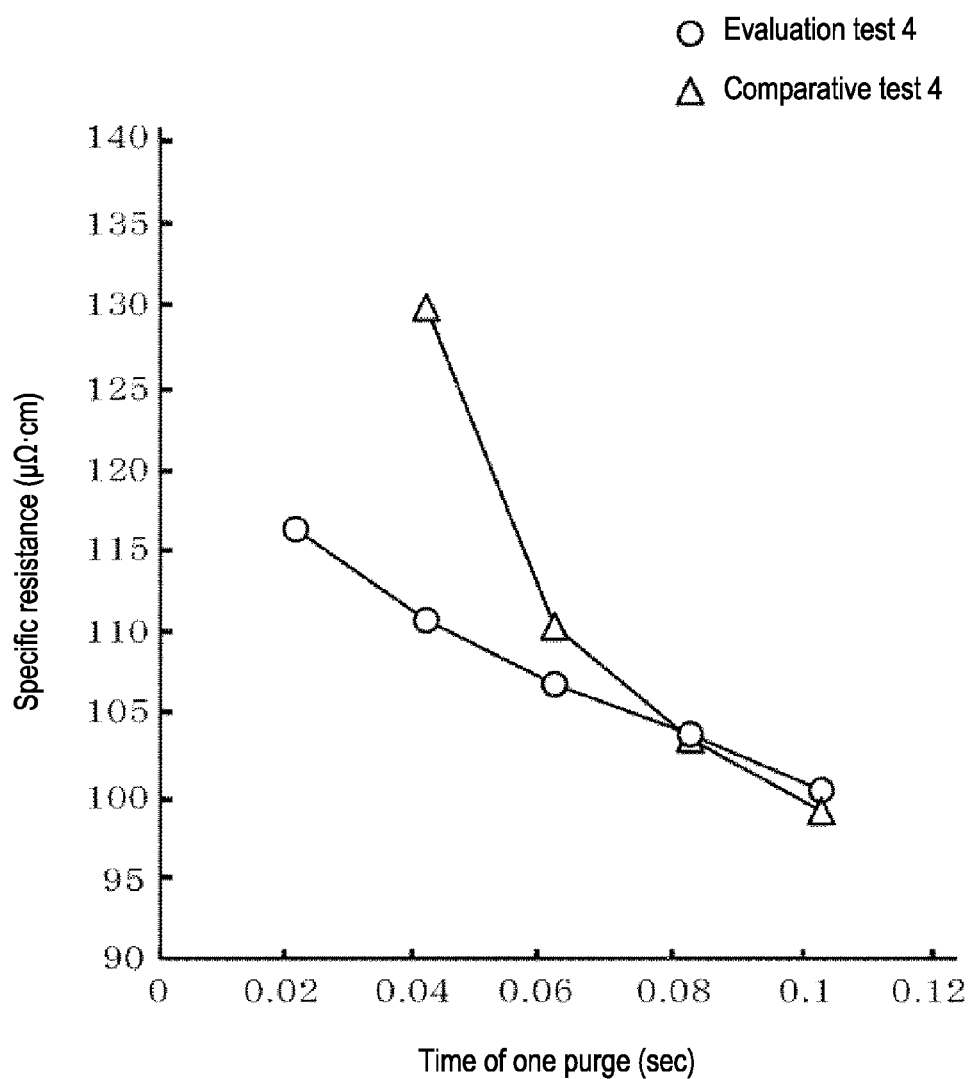

FIGS. 14 and 15 are graphs illustrating the results of Evaluation Test 4 and Comparative Test 4. In FIGS. 14 and 15, the horizontal axes of the graphs represent the time period performing one purge (unit: second). The vertical axis of the graph in FIG. 14 represents the measured film thickness (unit: Å) of a TiN film, and the vertical axis of the graph in FIG. 15 represents the measured specific resistance (unit: $\mu\Omega\cdot cm$) of the TiN film. The results of Comparative Test 4 are plotted as triangles on the graph, and the results of Evaluation Test 4 are plotted as circles on the graph. The graphs show that the film thickness and the specific resistance are decreased as the time period performing one purge was increased both in Evaluation Test 4 and in Comparative Test 4, and there was no large difference in the film thickness and in the specific resistance between Evaluation Test 4 and Comparative Test 4 when the time period performing one purge was 0.06 seconds, 0.08 seconds, and 0.1 seconds. However, when the time period performing one purge was 0.04 seconds, the film thickness and the specific resistance in Evaluation Test 4 were significantly lower than the film thickness and the specific resistance in Comparative Test 4. Accordingly, despite the short purging time, the TiN film having a better characteristic was obtained in Evaluation Test 4. Thus, it was confirmed from Evaluation Test 4 that the film forming apparatus 1 could make the time for purging shorter than the time for purging in the film forming apparatus 8, thereby enhancing throughput.

According to the present disclosure, a substitution gas flow passage is provided to supply a substitution gas into a processing chamber through a supply control device that is independent of (or different from) carrier gas supply control devices installed on first and second carrier gas flow passages that are connected to a source gas flow passage and a reaction gas flow passage, respectively. The substitution gas flow passage is provided with a gas storage part that stores the substitution gas to increase the internal pressure of the gas storage part and then supplies the stored substitution gas to the processing chamber, according to opening/closing of a valve. Accordingly, it is possible to supply the substitution gas into the processing chamber at a relatively high flow rate and to rapidly replace the atmosphere in the processing chamber, thereby increasing the throughput of the apparatus. Furthermore, the supply of the substitution gas into the processing chamber is controlled independently of a carrier gas so that it is possible to suppress an increase in the flow rate of the carrier gas, thereby preventing the source gas from being diluted with the carrier gas. As a result, it is possible to form a film having good coverage for a substrate while suppressing an increase in the flow rate of the source gas required for the film formation.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A gas supply apparatus for forming a film by sequentially supplying a source gas, a substitution gas, and a reaction gas to a substrate in a processing chamber under a vacuum atmosphere for a plurality of cycles, wherein the substitution gas substitutes an atmosphere, and the reaction gas reacts with the source gas and generates a reaction product on the substrate, the apparatus comprising:
   a source gas flow passage configured to supply the source gas into the processing chamber, a source gas supply control device being installed in the source gas flow passage;
   a reaction gas flow passage installed independently of the source gas flow passage, and configured to supply the reaction gas into the processing chamber, a reaction gas supply control device being installed in the reaction gas flow passage;
   a first carrier gas flow passage and a second carrier gas flow passage connected to the source gas flow passage and the reaction gas flow passage, respectively, and configured to supply a carrier gas, a carrier gas supply control device being installed in each of the first carrier gas flow passage and the second carrier gas flow passage, and a valve being installed in a downstream side of each of the first carrier gas flow passage and the second carrier gas flow passage;

a substitution gas flow passage configured to supply the substitution gas into the processing chamber through a supply control device, the supply control device being different from the carrier gas supply control devices which are installed in the first carrier gas flow passage and the second carrier gas flow passage, and also being different from the source gas supply control device and the reaction gas supply control device;

a substitution gas storage part installed in the substitution gas flow passage, and configured to store only the substitution gas;

a valve installed in the substitution gas flow passage, and installed in a downstream side of the substitution gas storage part; and a control unit configured to control opening and closing of the valves such that after the substitution gas is stored in the substitution gas storage part to increase an internal pressure of the substitution gas storage part, the substitution gas is supplied into the processing chamber from the substitution gas storage part, wherein a first orifice and a second orifice are installed in a downstream side of the valve of the first carrier gas flow passage and a downstream side of the valve of the second carrier gas flow passage, respectively, wherein a diameter of the downstream side of the valve of the first carrier gas flow passage and a diameter of the downstream side of the valve of the second carrier gas flow passage are smaller than a diameter of an upstream side of the valve of the first carrier gas flow passage and a diameter of an upstream side of the valve of the second carrier gas flow passage, respectively, and are smaller than a diameter of the substitution gas flow passage; and wherein a time period during which the carrier gas is supplied into the processing chamber and a time period during which the substitution gas is supplied into the processing chamber overlap with each other.

2. The apparatus of claim 1, wherein the substitution gas flow passage includes a first substitution gas flow passage connected to the source gas flow passage and a second substitution gas flow passage connected to the reaction gas flow passage.

3. The apparatus of claim 1, wherein the carrier gas is continuously supplied into the processing chamber during the plurality of cycles.

4. The apparatus of claim 1, wherein a flow rate of the carrier gas supplied into the processing chamber is 1,000 sccm or less.

5. The apparatus of claim 1, wherein the source gas is a titanium chloride gas or a tungsten chloride gas, and the reaction gas is a nitrifying gas that nitrifies the source gas and forms titanium nitride or tungsten nitride on the substrate.

* * * * *